United States Patent
Takahashi et al.

(10) Patent No.: US 7,598,589 B2
(45) Date of Patent: Oct. 6, 2009

(54) SEMICONDUCTOR DEVICE

(75) Inventors: Nobuyoshi Takahashi, Nara (JP);
Satoshi Iwamoto, Toyama (JP);
Fumihiko Noro, Toyama (JP);
Masatoshi Arai, Nara (JP)

(73) Assignee: Panasonic Corporation, Osaka (JP)

( * ) Notice: Subject to any disclaimer, the term of this patent is extended or adjusted under 35 U.S.C. 154(b) by 590 days.

(21) Appl. No.: 11/152,114

(22) Filed: Jun. 15, 2005

(65) Prior Publication Data

US 2006/0086971 A1 Apr. 27, 2006

(30) Foreign Application Priority Data

Oct. 22, 2004 (JP) .............................. 2004-308646

(51) Int. Cl.
*H01L 27/105* (2006.01)
(52) U.S. Cl. ................................ 257/501; 257/E21.54
(58) Field of Classification Search ................. 257/500, 257/501, 391, E21.54; 365/181, 182
See application file for complete search history.

(56) References Cited

U.S. PATENT DOCUMENTS

| 6,486,033 | B1 * | 11/2002 | Tu et al. ........................ 438/275 |
| 6,921,947 | B2 * | 7/2005 | Furuta et al. .................. 257/368 |
| 7,217,619 | B2 * | 5/2007 | Knoefler ....................... 438/261 |
| 2001/0006244 | A1 | 7/2001 | Shimizu et al. |
| 2002/0130382 | A9 * | 9/2002 | Shimizu et al. ............... 257/501 |
| 2002/0195647 | A1 * | 12/2002 | Aritome ....................... 257/315 |
| 2003/0030097 | A1 | 2/2003 | Lee et al. |
| 2003/0194841 | A1 * | 10/2003 | Inoue et al. .................. 438/257 |
| 2004/0113229 | A1 * | 6/2004 | Gonzalez et al. ............. 257/509 |
| 2004/0147099 | A1 * | 7/2004 | Hashimoto et al. ........... 438/584 |

FOREIGN PATENT DOCUMENTS

| JP | 2001-077220 | 3/2001 |
| JP | 2002-043442 | 2/2002 |
| JP | 2003-142656 | 5/2003 |
| JP | 2004-247633 | 9/2004 |
| JP | 2005-123348 | 5/2005 |

OTHER PUBLICATIONS

Chinese Office Action, with English Abstract, issued in Chinese Patent Application No. CN 200510116453.1 dated on Jan. 16, 2009.
Japanese Office Action, with English translation, issued in Japanese Patent Application No. JP 2004-308646, mailed Oct. 7, 2008.

* cited by examiner

*Primary Examiner*—Jerome Jackson, Jr.
*Assistant Examiner*—Paul A Budd
(74) *Attorney, Agent, or Firm*—McDermott Will & Emery LLP

(57) ABSTRACT

A semiconductor device includes a memory section formed at a semiconductor substrate and including a first transistor having an ONO film that can store charges between the semiconductor substrate and a memory electrode and a first STI region for isolating the first transistor, and a CMOS section formed at the semiconductor substrate and including a second transistor having a CMOS electrode and a gate dielectric and a second STI region for isolating the second transistor. The height of the top surface of the first STI region is set equal to or smaller than the height of the top surface of the second STI region.

4 Claims, 9 Drawing Sheets

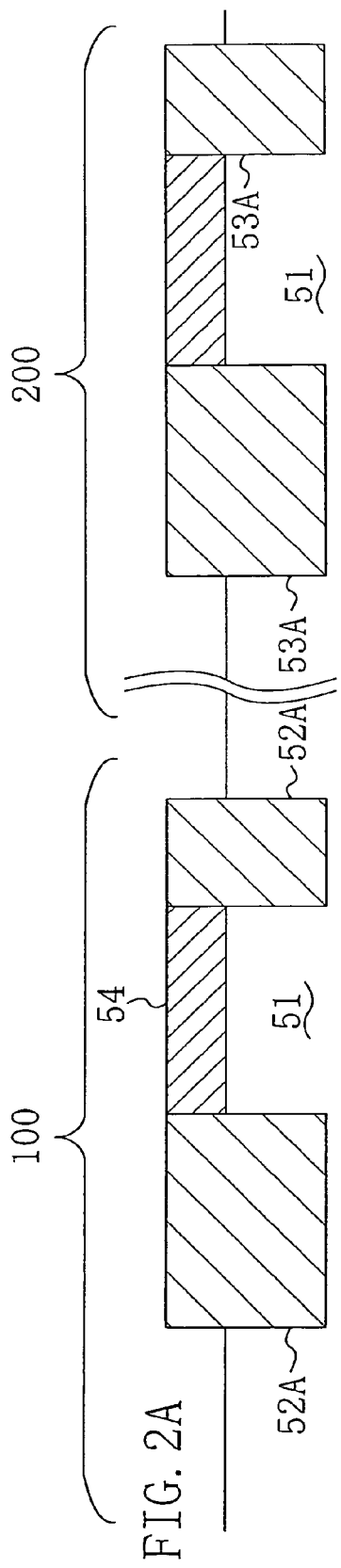
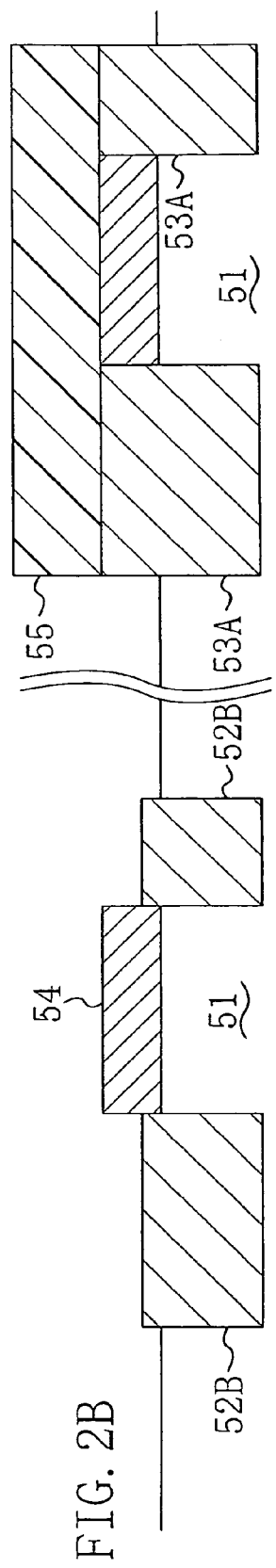
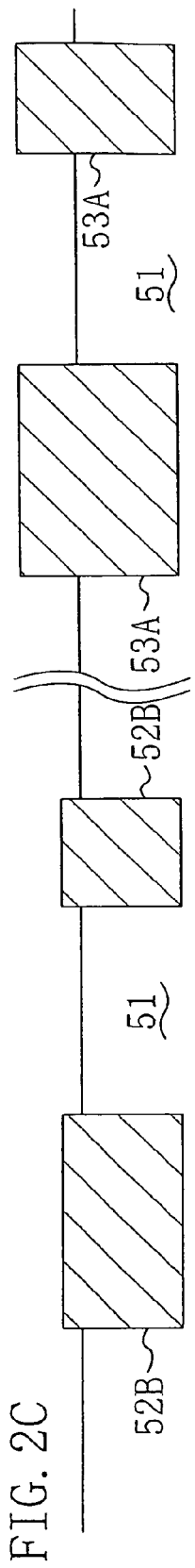

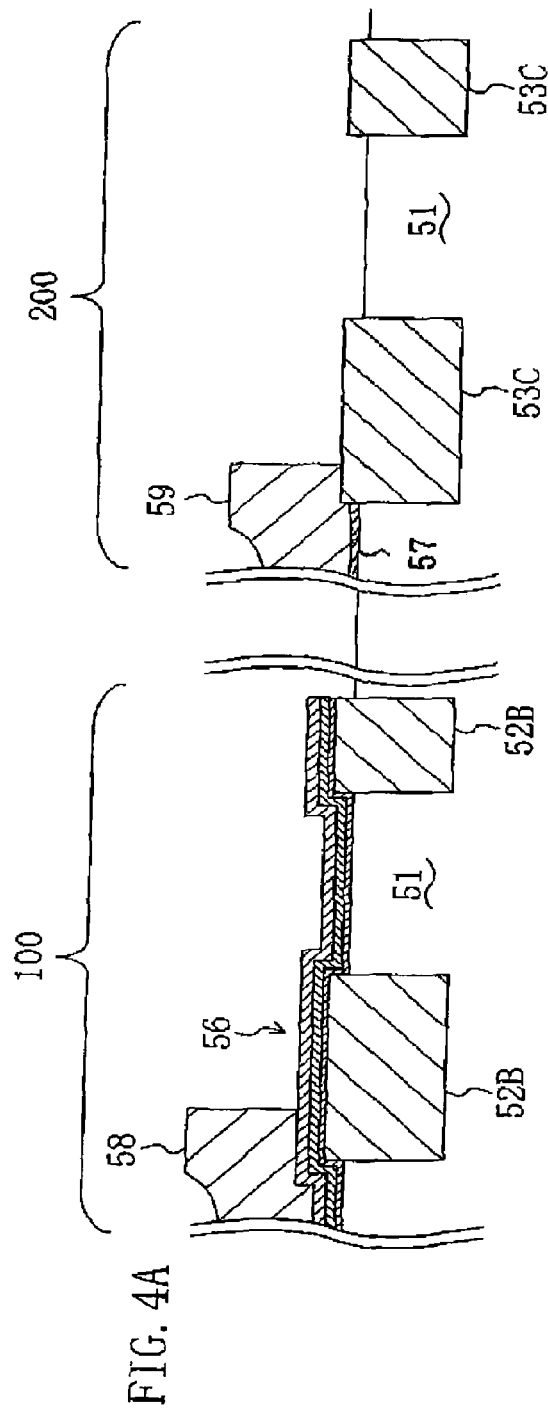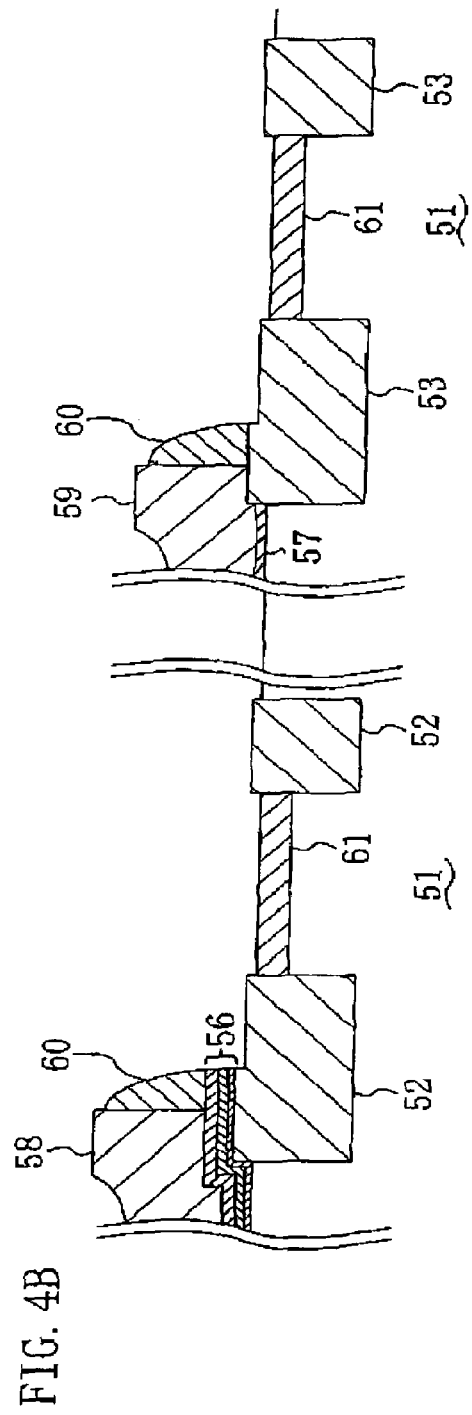

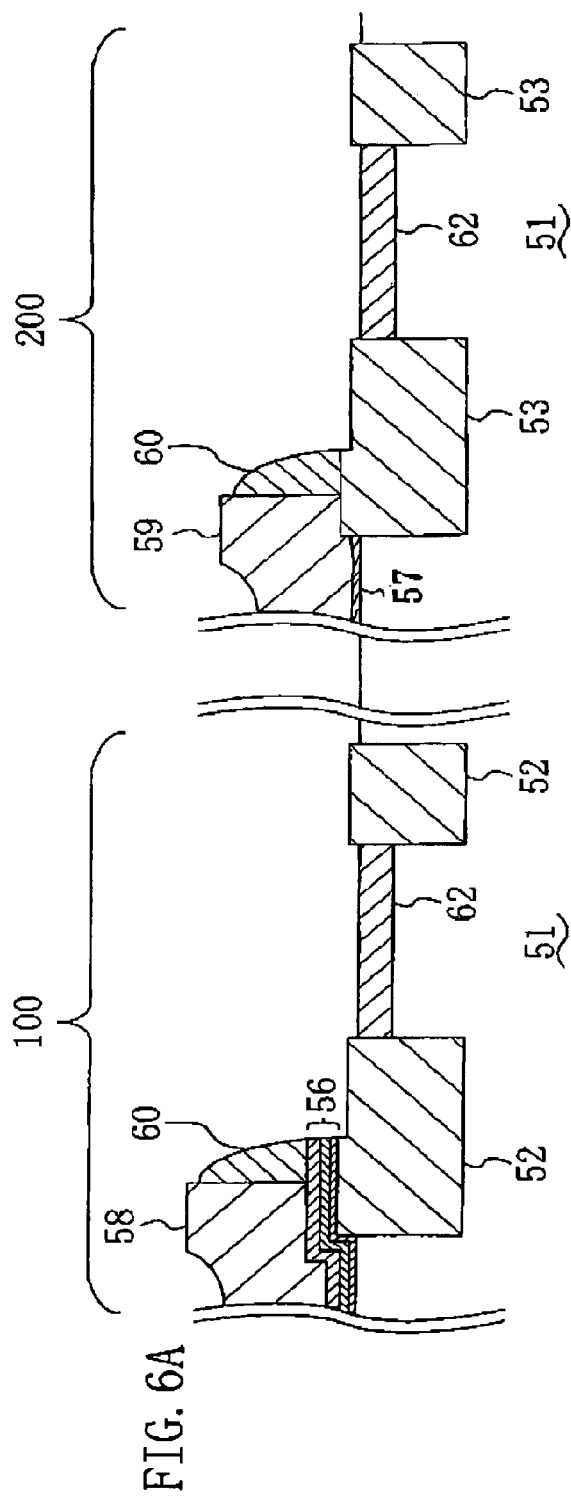
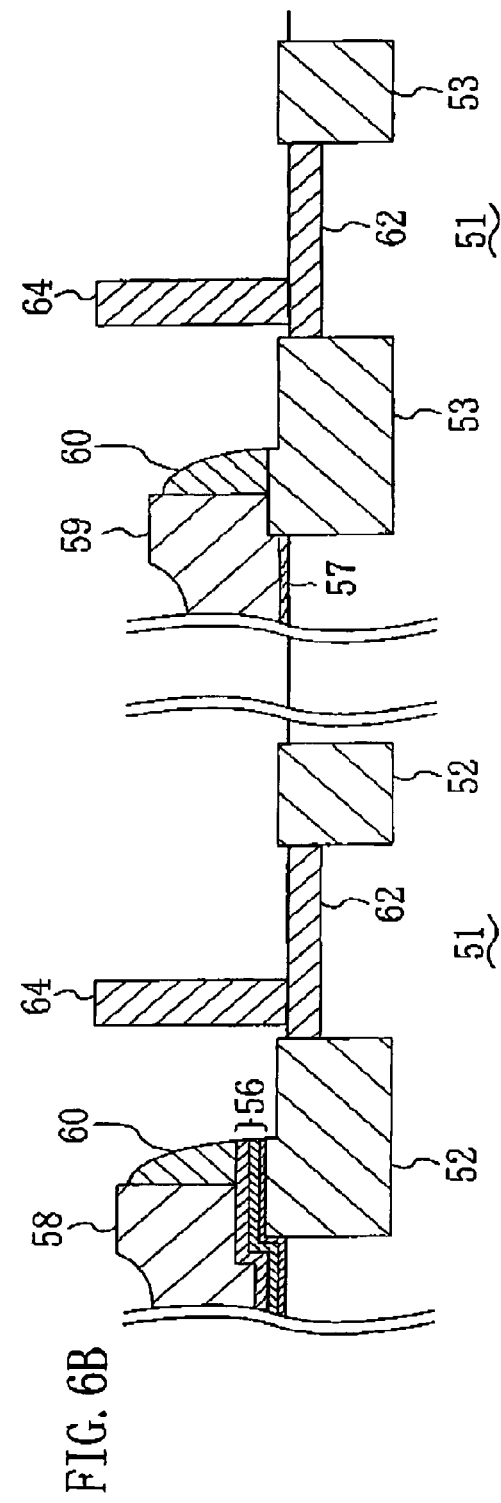
FIG. 6A
FIG. 6B

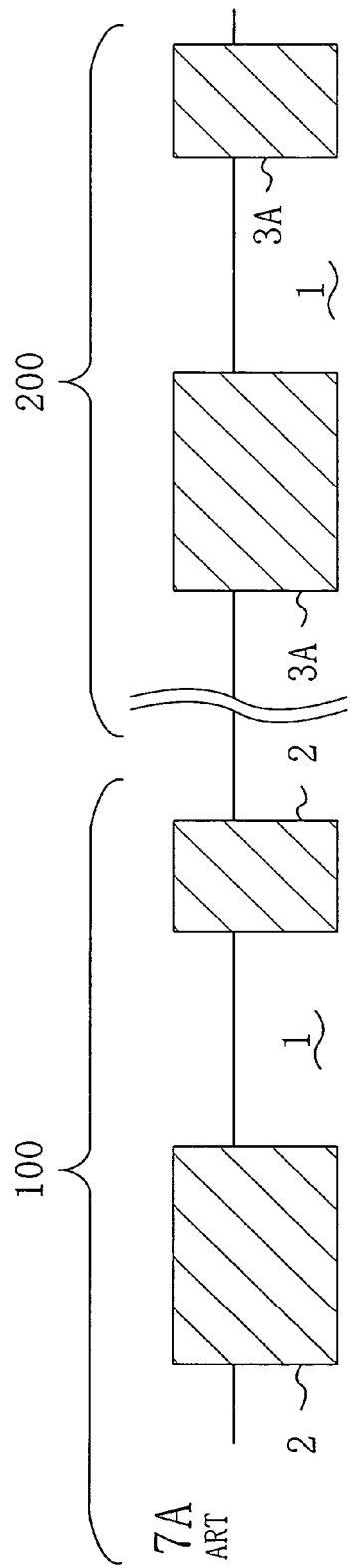
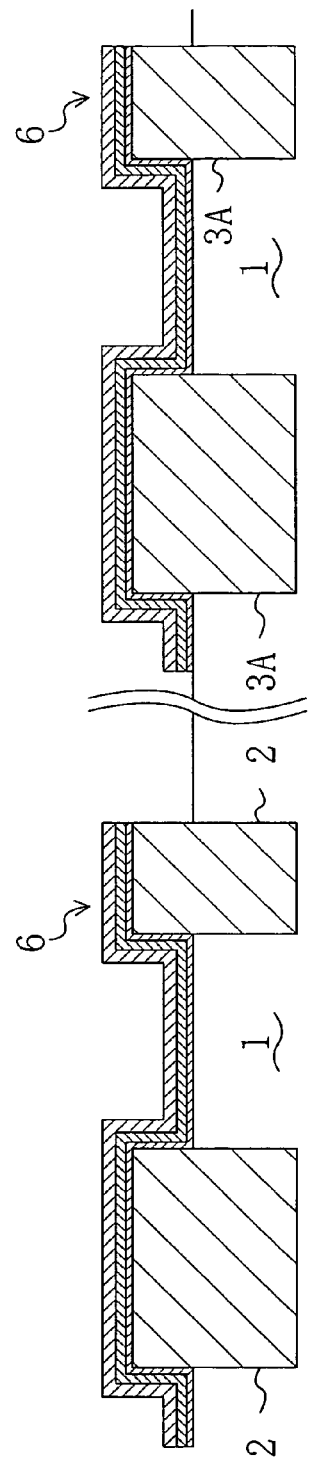
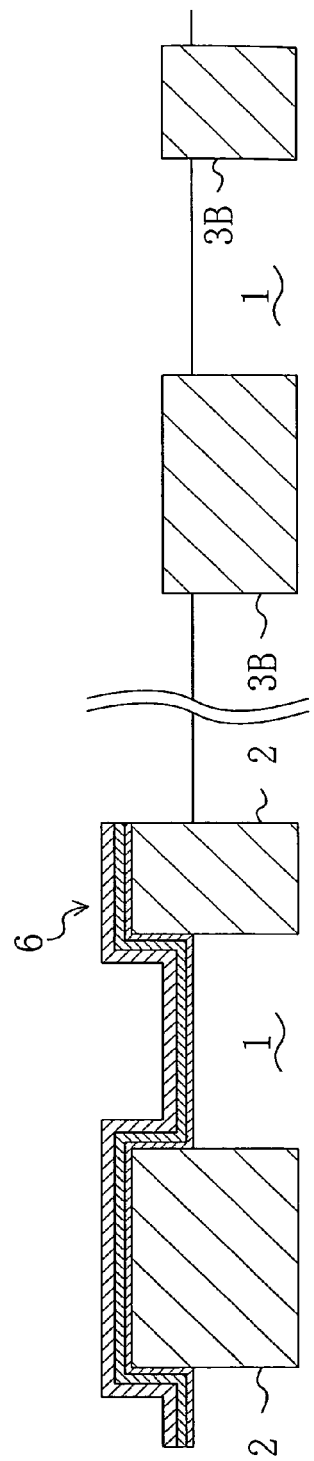
FIG. 7A PRIOR ART
FIG. 7B PRIOR ART
FIG. 7C PRIOR ART

SEMICONDUCTOR DEVICE

CROSS-REFERENCE TO RELATED APPLICATIONS

The disclosure of Japanese Patent Application No. 2004-308646 filed on Oct. 22, 2004 including specification, drawings and claims is incorporated herein by reference in its entirety.

BACKGROUND OF THE INVENTION (1) Field of the Invention

The present invention relates to a semiconductor device having, on a semiconductor substrate, a memory section having an ONO (an upper silicon oxide layer/a silicon nitride layer/a lower silicon oxide layer) film as a gate dielectric and a logic (CMOS) section and a method for fabricating the same.

(2) Description of Related Art

With advances in miniaturization of elements, increasing significance has been attached to semiconductor devices in which a memory section and a CMOS section are formed on the same semiconductor substrate and which use an ONO film as a gate dielectric of a memory transistor constituting a part of the memory section.

A known semiconductor device in which a memory section and a CMOS section are combined and a method for fabricating the same will be described hereinafter with reference to FIGS. 7A through 8C.

First, as shown in FIG. 7A, a first shallow trench isolation (STI) region 2 is formed in a memory formation area 100 of the upper part of a semiconductor substrate 1, for example, made of silicon, and a second shallow trench isolation (STI) region 3A is formed in a CMOS formation area 200 of the upper part of the semiconductor substrate 1. In this case, the step height between the first STI region 2 and the semiconductor substrate 1 and the step height between the second STI region 3A and the semiconductor substrate 1 are both, for example, about 100 nm.

Next, as shown in FIG. 7B, an ONO film 6 made of a first silicon oxide film, a silicon nitride film and a second silicon oxide film is entirely formed on the memory formation area 100 and the CMOS formation area 200 of the semiconductor substrate 1.

Next, as shown in FIG. 7C, a bit line (not shown) is formed in the memory formation area 100 of the upper part of the semiconductor substrate 1, and then a part of the ONO film 6 covering the CMOS formation area 200 is removed by wet etching. At this time, the upper part of the second STI region 3A is cut away by wet etching, cleaning and other process steps. As a result, a second STI region 3B is obtained.

Next, as shown in FIG. 8A, a gate dielectric 7 is formed on a part of the semiconductor substrate 1 located in the CMOS formation area 200 by thermal oxidation. In this relation, in the CMOS formation area 200, the upper part of the second STI region 3B is further cut away by cleaning and other process steps also during the formation % of the gate dielectric 7. As a result, a second STI region 3C is obtained. Consequently, the step height between the second STI region 3C and the semiconductor substrate 1 is reduced to, for example, about 50 nm.

On the other hand, since in the memory formation area 100 the first STI region 2 is covered with the ONO film 6, the step height between the first STI region 2 and the semiconductor substrate 1 is not reduced. As a result, the step height therebetween is still about 100 nm.

Next, as shown in FIG. 8B, in the memory formation area 100, a memory electrode 8 serving as a gate electrode is formed to cover part of the first STI region 2 across one end thereof, while in the CMOS formation area 200 a CMOS electrode 9 serving as a gate electrode is formed to cover part of the second STI region 3C across one end thereof. In this relation, as described above, the step height between the first STI region 2 and the semiconductor substrate 1 is 100 nm, which is larger than the step height between the third STI region 3C and the semiconductor substrate 1, i.e., about 50 nm.

Next, as shown in FIG. 8C, when the CMOS formation area 200 undergoes a process step of forming a sidewall on a side of the CMOS electrode 9 or other process steps, sidewalls 10 are formed not only on a side of the memory electrode 8 but also on the sides of stepped portions of the first STI region 2 in the memory formation area 10 having a large step height between the first STI region 2 and the semiconductor substrate 1. Therefore, the sidewalls 10 on the stepped portions reduce the surface areas of diffusion layers 11 to be formed in a later diffusion layer formation process step by source/drain (S/D) implantation. At this time, in the CMOS formation area 200, the step height between a part of the second STI region 3C not covered with the CMOS electrode 9 and the semiconductor substrate 1 becomes approximately 0. As a result, a second STI region 3D is obtained.

More particularly, in this process step, in the CMOS formation area 200, the step height between a part of the second STI region 3D located under the CMOS electrode 9 and the semiconductor substrate 1 is approximately 50 nm, and the step height between a part of the second STI region 3D that is not covered with the CMOS electrode 9 and the semiconductor substrate 1 is approximately 0. On the other hand, in the memory formation area 100, the step height between a part of the first STI region 2 located under the memory electrode 8 and the semiconductor substrate 1 is approximately 100 nm, and the step height between a part of the first STI region 2 that is not covered with the memory electrode 8 and the semiconductor substrate 1 is approximately 50 nm.

Values of the step heights between each of the STI regions 2, 3A and the like and the semiconductor substrate 1 are merely given as an example and actually vary within a range of several tens of nm due to variations in process steps. However, the step height between the part of the first STI region 2 located under the memory electrode 8 and the semiconductor substrate 1 and the step height between the part of the second STI region 3D located under the CMOS electrode 9 and the semiconductor substrate 1 have the following relationship: the step height between the first STI region 2 and the semiconductor substrate 1 is always larger than the step height between each of the second STI regions 3C and 3D that are reduced in thickness after process steps in FIGS. 7 and 8 and the semiconductor substrate 1. The reason for this is that the first STI region 2 is covered with the ONO film 6.

By the way, as shown in FIG. 9A, when silicide layers 12 are formed in the semiconductor substrate 1, the sidewalls 10 formed on the stepped portions of the first STI region 2 in the memory formation area 100 reduce the areas of the silicide layers 12. Therefore, when as shown in FIG. 9B contacts 13 are formed on the silicide layers 12 in the memory formation area 100, overlapping margins of the formed contacts 13 and the silicide layers 12 become small.

As described above, according to the known semiconductor device fabricating method, since the step height between the first STI region 2 and the semiconductor substrate 1 in the memory formation area 100 is larger than the step height between the second STI region 3D and the semiconductor substrate 1 in the CMOS formation area 200, the sidewalls 10 formed on the sides of the stepped portions of the first STI region 2 causes the following problems.

First, the surface areas of the diffusion layers 11 formed by source/drain (S/D) implantation are reduced, leading to the increased resistance in the diffusion layers (hereinafter, referred to as "diffusion layer resistance"). In particular, when the silicide layers 12 are formed in the semiconductor substrate 1 and used as thin-wire resistors, the sidewalls 10 formed on the stepped portions of the first STI region 2 of the memory formation area 100 reduce the widths of the silicide layers 12. This increases the thin-wire resistance in the silicide layers 12 (hereinafter, referred to as "silicide thin-wire resistance").

Second, when the contacts 13 are formed on the diffusion layers 11, the diffusion layers 11 are reduced in their surface areas. This reduces the overlapping margins of the contacts 13 and the diffusion layers 11.

SUMMARY OF THE INVENTION

The present invention is made in view of the above conventional problems, and its object is to prevent increase in the diffusion layer resistance in a memory section and further, when the diffusion layers are silicided, increase in the silicide thin-wire resistance and prevent reduction in overlapping margins of contacts and the diffusion layers.

In order to achieve the above object, the present invention is directed to a semiconductor device in which a memory section having a memory transistor including a gate dielectric that is formed on a semiconductor region and an isolation region and can store charges and a logic section including a transistor and an isolation region are combined, and the semiconductor device is configured so that before the formation of the gate dielectric that can store charges, the upper part of the isolation region located in a memory formation area of the substrate is previously removed, thereby making the step height between the isolation region located in the memory formation area and the semiconductor region small.

To be specific, a semiconductor device of the present invention includes: a memory section formed in a semiconductor region and including a first transistor having a first gate electrode and a first gate dielectric that can store charges between the semiconductor region and the first gate electrode and a first isolation region for isolating the first transistor; and a logic section formed in the semiconductor region and including a second transistor having a second gate electrode and a second gate dielectric and a second isolation region for isolating the second transistor, wherein, in the memory section, the first gate dielectric and the first gate electrode are formed to partly cover the first isolation region, in the logic section, the second gate dielectric and the second gate electrode are formed to partly cover the second isolation region, and the height of the top surface of a part of the first isolation region partly covered with the first gate dielectric and the first gate electrode from the top surface of the semiconductor region is equal to or smaller than the height of the top surface of a part of the second isolation region partly covered with the second gate dielectric and the second gate electrode therefrom.

In the device of the present invention, the first gate dielectric is preferably a multilayer film of silicon nitride and silicon oxide.

In the device of the present invention, the first gate dielectric is preferably an ONO film (a multilayer film obtained by successively stacking a silicon oxide film, a silicon nitride film and a silicon oxide film).

In the device of the present invention, the first and second isolation regions are preferably trench isolation regions obtained by filling trenches formed in the upper part of the semiconductor region.

In the device of the present invention, it is preferable that the first transistor has diffusion layers formed in the upper part of the semiconductor region and metal silicide layers are formed on the diffusion layers.

A method for fabricating a semiconductor device of the present invention is directed to a method for fabricating a semiconductor device including a memory section formed in a semiconductor region and including a first transistor having a first gate dielectric that can store charges and a first isolation region for isolating the first transistor, and a logic section including a second transistor having a second gate dielectric and a second isolation region for isolating the second transistor. The method includes the steps of: (a) forming the first isolation region and the second isolation region in a memory formation area and a logic formation area of the semiconductor region, respectively; (b) making the height of the first isolation region from the top surface of the semiconductor region smaller than that of the second isolation region from the top surface of the semiconductor region; (c) after the step (b), forming the first gate dielectric on all the surfaces of the memory formation area and the logic formation area of the semiconductor region, the first isolation region and the second isolation region; (d) removing a part of the first gate dielectric covering the logic section; (e) forming the second gate dielectric on the logic formation area of the semiconductor region; (f) forming a gate electrode of the first transistor on the first gate dielectric in the memory formation area and forming a gate electrode of the second transistor on the second gate dielectric in the logic formation area; (g) forming sidewalls on respective at least one sides of the gate electrodes of the first and second transistors; and (h) forming source/drain diffusion layers of the first transistor in the memory formation area of the semiconductor region and source/drain diffusion layers of the second transistor in the logic formation area of the semiconductor region.

In the method of the present invention, the first gate dielectric is preferably a multilayer film of silicon nitride and silicon oxide.

In the method of the present invention, the first gate dielectric is preferably an ONO film (a multilayer film obtained by successively stacking a silicon oxide film, a silicon nitride film and a silicon oxide film).

In the method of the present invention, the first and second isolation regions are preferably trench isolation regions obtained by forming trenches in the upper part of the semiconductor region and filling the formed trenches with an insulator.

In the method of the present invention, the step (b) preferably includes the steps of: forming a mask pattern having an opening corresponding to the memory formation area; and selectively removing the upper part of the first isolation region by etching using the formed mask pattern.

It is preferable that the method of the present invention further includes the step of forming metal silicide layers on the source/drain diffusion layers of the first transistor and the source/drain diffusion layers of the second transistor.

Thus, according to the semiconductor device of the present invention and the method for fabricating the same, since the height of the top surface of the first isolation region in the memory formation area from the top surface of the semiconductor region is made equal to or smaller than that of the top surface of the second isolation region in the logic formation area from the top surface of the semiconductor region, a sidewall located on a side of the first isolation region becomes small. Therefore, the areas of the diffusion layers of the first transistor in the memory formation area are not reduced. This can prevent increase in the diffusion layer resistance or, when the diffusion layers are silicided, increase in the silicide thin-wire resistance and reduction in the overlapping margins of the contacts and the diffusion layers.

BRIEF DESCRIPTION OF THE DRAWINGS

FIGS. 2A through 2C are cross-sectional views schematically showing some of process steps of a fabricating method of a semiconductor device according to the first embodiment of the present invention step by step.

FIGS. 4A and 4B are cross-sectional views schematically showing some of process steps of the fabricating method of a semiconductor device according to the first embodiment of the present invention step by step.

FIGS. 6A and 6B are cross-sectional views schematically showing some of process steps of a fabricating method of a semiconductor device according to the second embodiment of the present invention step by step.

FIGS. 7A through 7C are cross-sectional views schematically showing some of process steps of a known fabricating method of a semiconductor device step by step.

DETAILED DESCRIPTION OF THE INVENTION

Embodiment 1

A semiconductor device according to a first embodiment of the present invention will be described with reference to FIG. 1.

Figure 1:
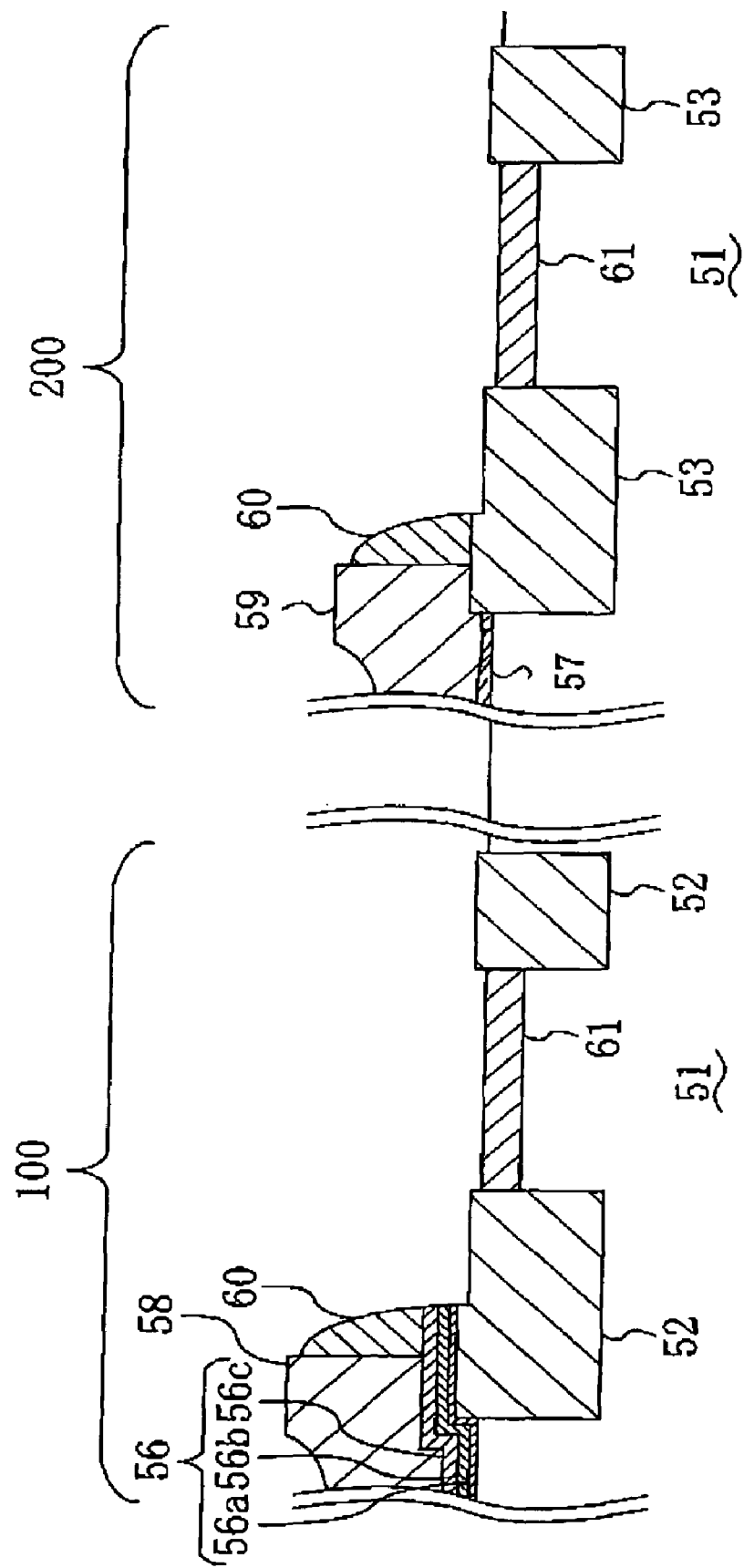
FIG. 1 is a cross-sectional view schematically showing the structure of a semiconductor device according to a first embodiment of the present invention.

As shown in FIG. 1, the semiconductor device of the first embodiment is formed at the semiconductor substrate 51, for example, made of p-type silicon (Si) and comprises a memory section including memory transistors having an ONO film 56 that can store charges and a CMOS section including transistors that constitute parts of peripheral circuits of the memory section and performing logical operation. In this relation, the ONO film 56 is formed by successively stacking, for example, a 5-nm-thick lower silicon oxide layer 56a, a 10-nm-thick silicon nitride layer 56b that is substantially a charge-storing material, and a 15-nm-thick upper silicon oxide layer 56c in bottom-to-top order.

In a memory formation area 100 that will become the memory section, a first shallow trench isolation (STI) region 52 is formed to isolate the memory transistors from one another, and the ONO film 56 is formed on an exposed surface portion of the semiconductor substrate 51 to cover part of the first STI region 52 across one end thereof. A memory electrode 58 serving as a first gate electrode is formed to cover part of the first STI region 52 across the one end thereof with the ONO film 56 interposed between the semiconductor substrate 51 and the memory electrode 58. A sidewall 60, for example, made of silicon oxide or silicon nitride, is formed on the side of the memory electrode 58 closer to the CMOS section. For example, n-type diffusion layers 61 are formed in regions of the upper part of the semiconductor substrate 51 opposite to the memory electrode 58 with respect to the first STI region 52.

In a CMOS formation area 200 that will become a CMOS section, a second shallow trench isolation (STI) region 53 is formed to isolate the transistors from one another. A CMOS electrode 59 serving as a second gate electrode is formed to cover part of the second STI region 53 across one end thereof.

The first embodiment is characterized as follows. The first STI region 52 is formed such that the height of the top surface of a part of the first STI region 52 partly covered with the ONO film 56 and the memory electrode 58 in the memory formation area 100 from the top surface of the semiconductor substrate 51 is equal to or smaller than that of the top surface of a part of the second STI region 53 partly covered with the CMOS electrode 59 in the CMOS formation area 200 from the top surface of the semiconductor substrate 51.

A fabricating method of the semiconductor device thus constructed will be described hereinafter with reference to FIGS. 2A through 4B.

First, as shown in FIG. 2A, a pad oxide film and a silicon nitride film 54 are formed on the principal surface of a semiconductor substrate 1, and then a trench for the formation of a STI is formed in a predetermined isolation region by dry etching, for example, using an etching gas that has a chlorine gas as the main component. Subsequently, an NSG (non-doped silicate glass) film of silicon oxide is entirely deposited, by chemical vapor deposition (CVD), on the formed silicon nitride film 54 and the trench to fill the trench. Then, the deposited NSG film is planarized by chemical mechanical polishing (CMP) until the silicon nitride film 54 is exposed. In this way, a first STI region 52A and a second STI region 53A are formed in the memory formation area 100 and the CMOS formation area 200, respectively, to both have a height of approximately 100 nm from the top surface of the semiconductor substrate 51.

Next, as shown in FIG. 2B, a resist mask 55 is formed on the semiconductor substrate 51 by lithography to have an opening pattern corresponding to the memory formation area 100, and the first STI region 52A is etched using the formed resist mask 55. In this manner, the height of the top surface of the first STI region 52A from the semiconductor substrate 51 is made lower than that of the top surface of the silicon nitride film 54 from the semiconductor substrate 51. In this embodiment, as an example, the first STI region 52A is etched away about 75 nm deep from the top, thereby forming a first STI region 52B having a height of about 25 nm from the top surface of the semiconductor substrate 51. This etching for the first STI region 52A may be dry etching or wet etching. While an etching gas, for example, having fluorocarbon as the main component is used for dry etching, an etchant, for example, containing hydrofluoric acid or buffered hydrofluoric acid, is used for wet etching.

Next, as shown in FIG. 2C, the resist mask 55 is removed by ashing or other process steps, and then the silicon nitride film 54 and the pad oxide film are removed. Thus, at this timing, the step height between the first STI region 52B and the memory formation area 100 of the semiconductor substrate 51 is smaller than that between the second STI region 53A and the CMOS formation area 200 of the semiconductor substrate 51. For example, at this timing, the step height between the first STI region 52B and the semiconductor substrate 51 is approximately 25 nm, and the step height between the second STI region 53A and the semiconductor substrate 51 is approximately 100 nm.

Figure 3A:
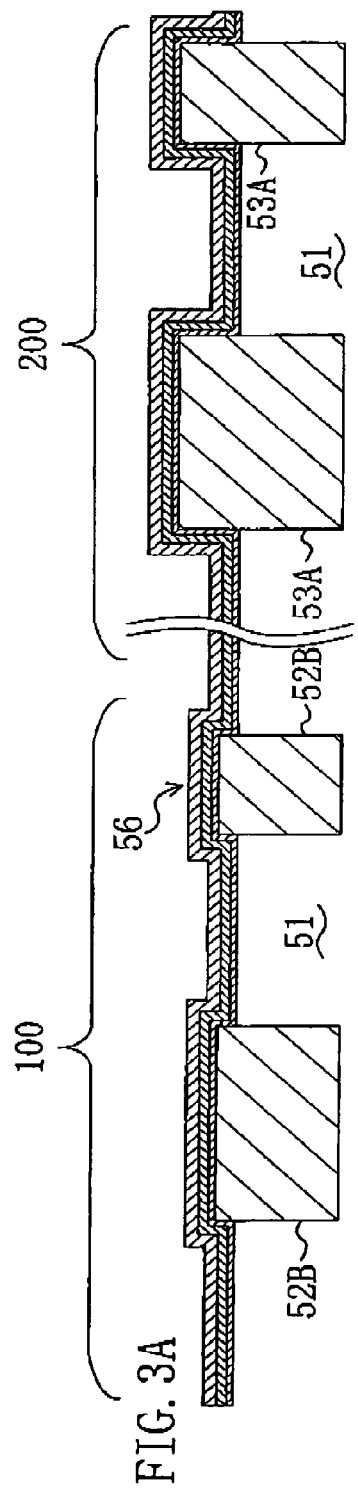
FIGS. 3A through 3C are cross-sectional views schematically showing some of process steps of the fabricating method of a semiconductor device according to the first embodiment of the present invention step by step.

Next, as shown in FIG. 3A, an ONO film 56 is formed on the entire surfaces of the semiconductor substrate 51, the first STI region 52B and the second STI region 53A, for example, by CVD.

Figure 3B:
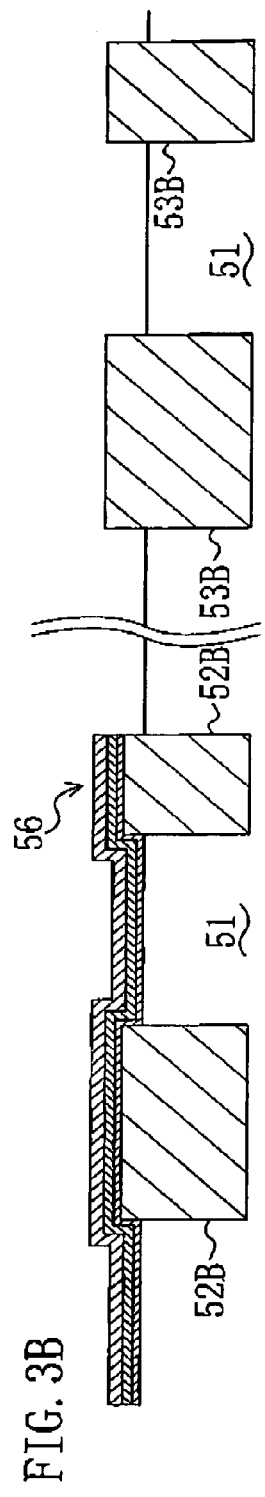

Next, as shown in FIG. 3B, diffusion layers (not shown) serving as bit lines are formed in the upper part of the semiconductor substrate 51 located in the memory formation area 100, and then a part of the ONO film 56 covering the CMOS formation area 200 is removed by etching. In this case, wet etching may be performed by using an etchant containing hydrofluoric acid or buffered hydrofluoric acid for an upper silicon oxide film and a lower silicon oxide film and thermal phosphoric acid for a silicon nitride layer. Thus, the upper part of the second STI region 53A is cut away by etching, cleaning and other process steps. As a result, a second STI region 53B is obtained.

Figure 3C:
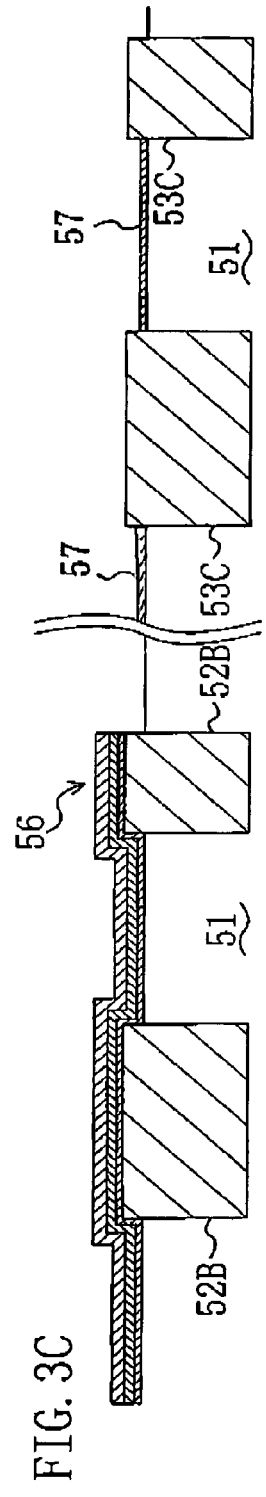

Next, as shown in FIG. 3C, a gate dielectric 57 is formed in a region of the semiconductor substrate 51 exposed at the CMOS formation area 200, for example, by thermal oxidation. Also during this formation of the gate dielectric 57, the upper part of the second STI region 53B is further cut away by cleaning and other process steps, thereby obtaining a second STI region 53C. As a result, the step height between the second STI region 53C and the semiconductor substrate 51 is reduced to, for example, approximately 50 nm. On the other hand, since the first STI region 52B is covered with the ONO film 56 in the memory formation area 100 during the process steps of removing a part of the ONO film 56 located in the CMOS formation area 200 and forming the gate dielectric 57, the step height between the first STI region 52B and the semiconductor substrate 51 is not reduced and still approximately 25 nm.

Next, as shown in FIG. 4A, a conductive film of doped polysilicon is deposited on the entire surface of the semiconductor substrate 51, for example, by CVD. Subsequently, a memory electrode 58 and a CMOS electrode 59 are formed of the deposited conductive film by lithography and etching to cover part of the first STI region 52B of the memory formation area 100 and part of the second STI region 53C of the CMOS formation area 200 across respective one ends of both the STI regions 52B and 53C. Polysilicon may be doped by ion implantation after the deposition of the conductive film made of polysilicon. At this time, as described above, the step height between the first STI region 52B and the semiconductor substrate 51 is made smaller than that between the second STI region 53C and the semiconductor substrate 51. In addition, in later process steps, the step height between the first STI region 52B of the memory formation area 100 and the semiconductor substrate 51 is not reduced, because the first STI region 52B is previously covered with the ONO film 56. Therefore, although the step height between the second STI region 53C of the CMOS formation area 200 and the semiconductor substrate 51 is reduced by wet etching, cleaning and other process steps, the step height between the first STI region 52B and the semiconductor substrate 51 can be made equal to or smaller than that between the second STI region 53C and the semiconductor substrate 51 even during the formation of the CMOS electrode 59.

Next, as shown in FIG. 4B, a part of the ONO film 56 of the memory formation area 100 exposed on the top surfaces of the semiconductor substrate 51 and the first STI region 52B is removed by etching. At this time, in the memory formation area 100, the step height between a part of the first STI region 52B that is not covered with the memory electrode 58 and the semiconductor substrate 51 becomes substantially 0. As a result, a second STI region 52 is obtained. Likewise, also in the CMOS formation area 200, the step height between a part of the second STI region 53C that is not covered with the CMOS electrode 59 and the semiconductor substrate 51 becomes substantially 0. As a result, a second STI region 53 is obtained. Subsequently, a dielectric of silicon oxide or silicon nitride is deposited on the entire surfaces of the semiconductor substrate 51, the memory electrode 58 and the CMOS electrode 59, for example, by CVD, and then the deposited dielectric is etched back using a fluorocarbon-base etching gas to form sidewalls 60 on respective at least one sides of the memory electrode 58 and the CMOS electrode 59. Subsequently, ions of n-type impurity, such as arsenic or phosphorus are implanted only into regions of the semiconductor substrate 51 opposite to the memory electrode 58 with respect to the first STI region 52 to form n-type diffusion layers 61.

As described above, even after the formation of the sidewall 60 on a side of the memory electrode 58 located on the memory formation area 100, the step height between the first STI region 52 and the semiconductor substrate 51 is equal to or smaller than that between the second STI region 53 of the CMOS formation area 200 and the semiconductor substrate 51. Therefore, unlike the known example, no other sidewalls are formed. As a result, the area of the semiconductor substrate 51 into which impurities are implanted to provide the diffusion layers 61 that will be source/drain diffusion layers in the memory formation area 100 is not reduced. For example, in the CMOS formation area 200, the step height between a part of the second STI region 53 located under the CMOS electrode 59 and the semiconductor substrate 51 is approximately 50 nm, and the step height between a part thereof that is not covered with the CMOS electrode 59 and the semiconductor substrate 51 becomes substantially 0. On the other hand, in the memory formation area 100, the step height between a part of the first STI region 52 located under the memory electrode 58 and the semiconductor substrate 51 is approximately 25 nm, and the step height between a part thereof that is not covered with the memory electrode 58 and the semiconductor substrate 51 becomes substantially 0. In this relation, the value of the step height between each of the STI regions 52 and 53 and the semiconductor substrate 51 is merely given as an example. Since, actually, there are variations in process steps, the value varies within a range of several tens of nm.

By the way, in the known example, as described above, the first STI region 2 is covered with the ONO film 6 from the early stage of a fabricating process. Therefore, the step height between the first STI region 2 and the semiconductor substrate 1 is inevitably larger than that between the second STI region 3D of the CMOS formation area 200 and the semiconductor substrate 1. The reason for this is that the second STI region 3D is reduced in thickness with the passage of subsequent process steps.

Meanwhile, in the first embodiment, the step height between the part of the first STI region 52 of the memory formation area 100 located under the memory electrode 58 and the semiconductor substrate 51 has the following relationship with that between the part of the second STI region 53 of the CMOS formation area 200 located under the CMOS electrode 59 and the semiconductor substrate 51. Since in the process step shown in FIG. 2B the first STI region 52A is reduced in height to become the first STI region 52B, the step height between the part of the first STI region 52 located under the memory electrode 58 and the semiconductor substrate 51 becomes equal to or smaller than that between the part of the second STI region 53 located under the CMOS electrode 59 and the semiconductor substrate 51.

Embodiment 2

Figure 5:
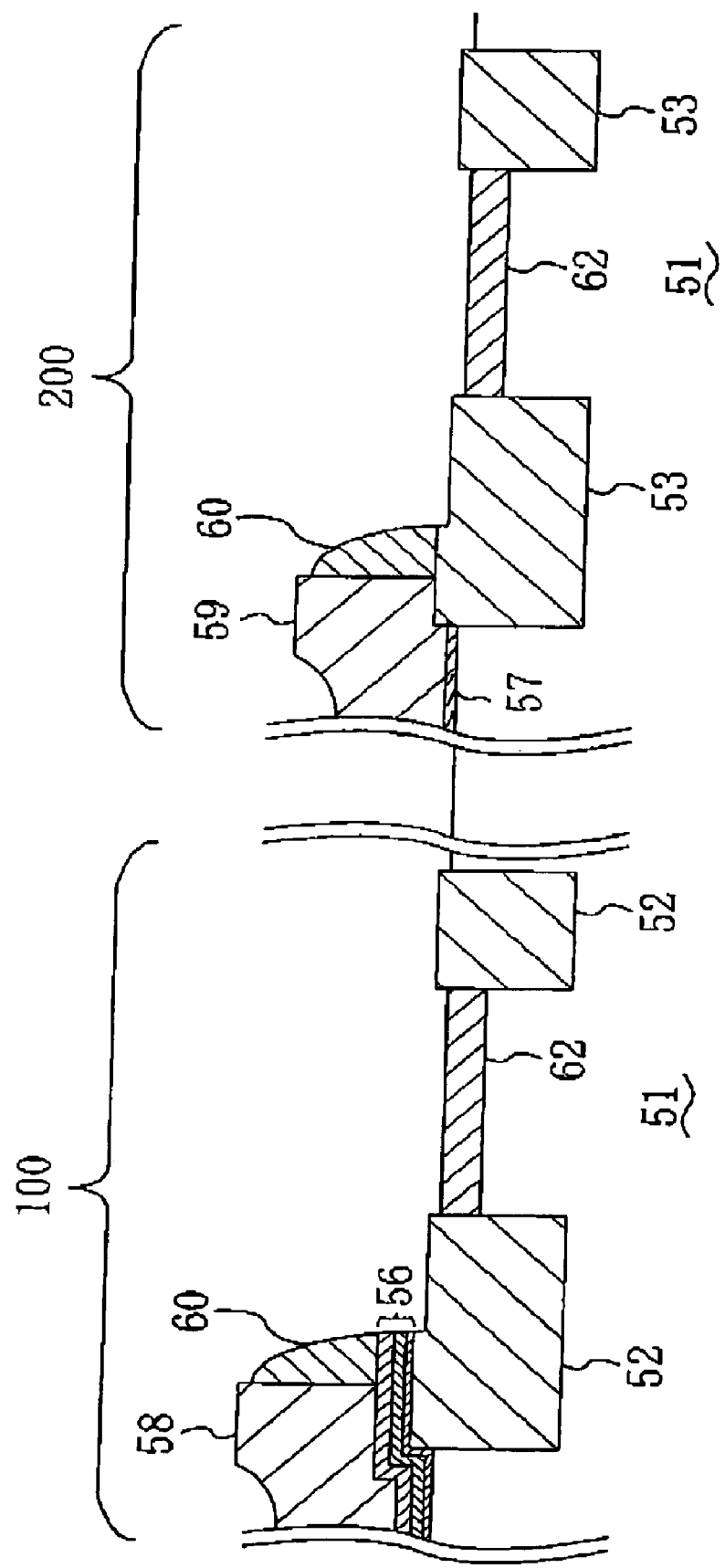
FIG. 5 is a cross-sectional view schematically showing the structure of a semiconductor device according to a second embodiment of the present invention.
Figures 8A, 8B, 8C:
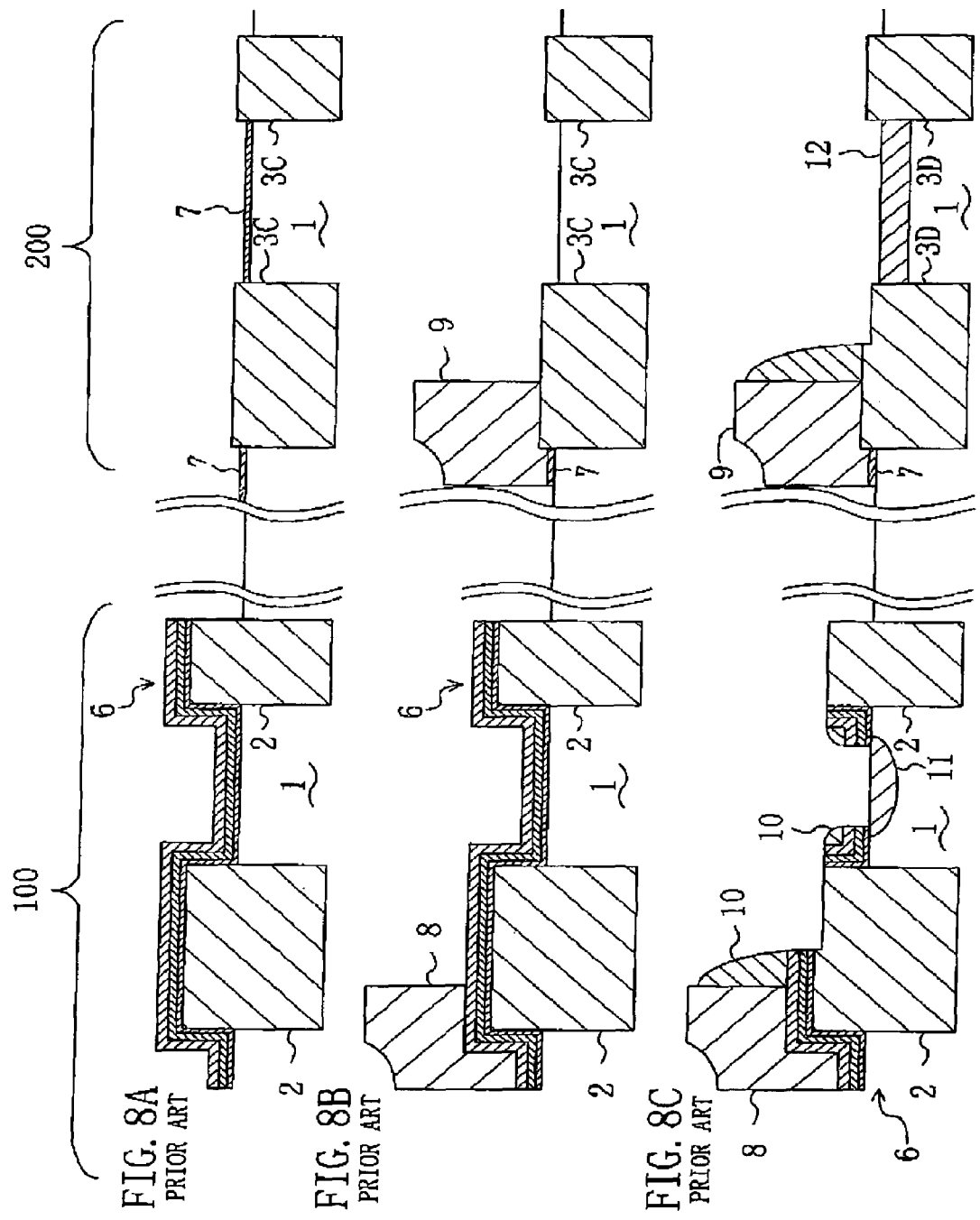
FIGS. 8A through 8C are cross-sectional views schematically showing some of process steps of the known fabricating method of a semiconductor device step by step.

A semiconductor device according to a second embodiment of the present invention will be described hereinafter with reference to FIG. 5. Referring to FIG. 5, the same numerals are given to the same components as in FIG. 1, and thus a description thereof is not given.

In the semiconductor device according to the second embodiment, the diffusion layers 61 of the first embodiment formed in the semiconductor substrate 51 are replaced with silicide layers 62 obtained by siliciding the diffusion layers 61.

As shown in FIG. 6A, the silicide layers 62 are formed by siliciding the diffusion layers 61 through a known siliciding process step. In this known siliciding process step, during the process step of the first embodiment shown in FIG. 4B, a metal film containing, for example, titanium (Ti), cobalt (Co) or nickel (Ni) is deposited on the diffusion layers 61 by vacuum evaporation or the like, and the deposited metal film is subjected to heat treatment.

Even after this siliciding process step, the step height between a first STI region 52 of a memory formation area 100 and a semiconductor substrate 51 becomes equal to or smaller than that between a second STI region 53 of a CMOS formation area 200 and the semiconductor substrate 51. Therefore, the sidewalls 10 shown in FIG. 9A of the known example are not formed on the sides of the stepped portions of the first STI region 52, and the silicide layers 62 of the memory formation area 100 are not reduced in area.

Figure 9A:
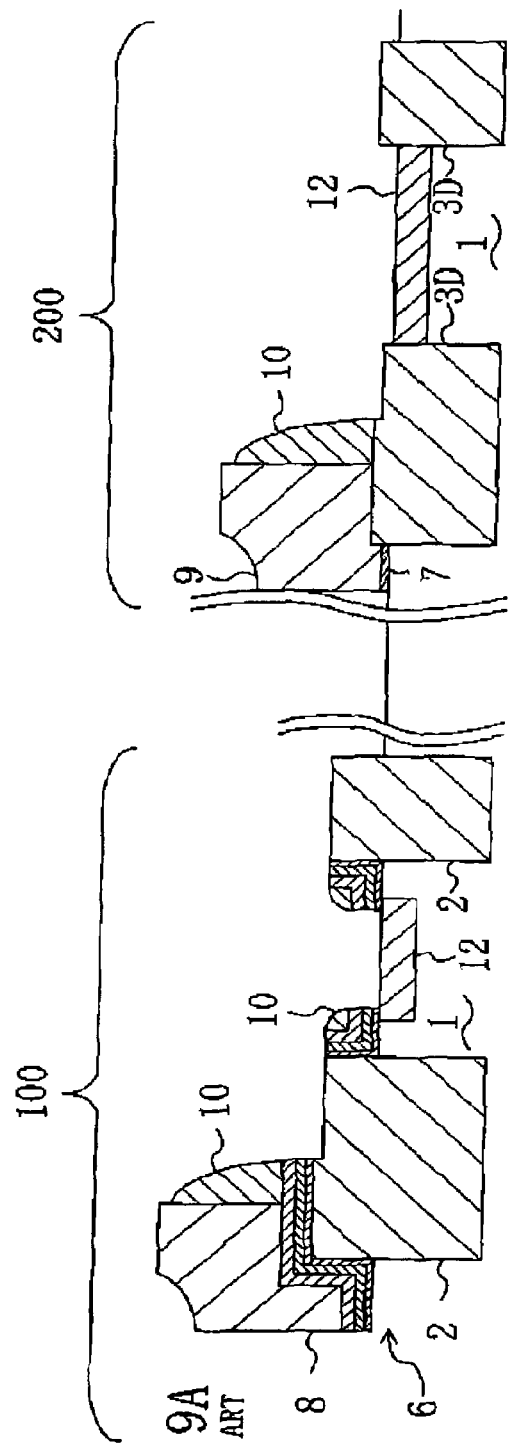
FIGS. 9A and 9B are cross-sectional views schematically showing some of process steps of a known fabricating method of a semiconductor device having silicided diffusion layers step by step.
Figure 9B:
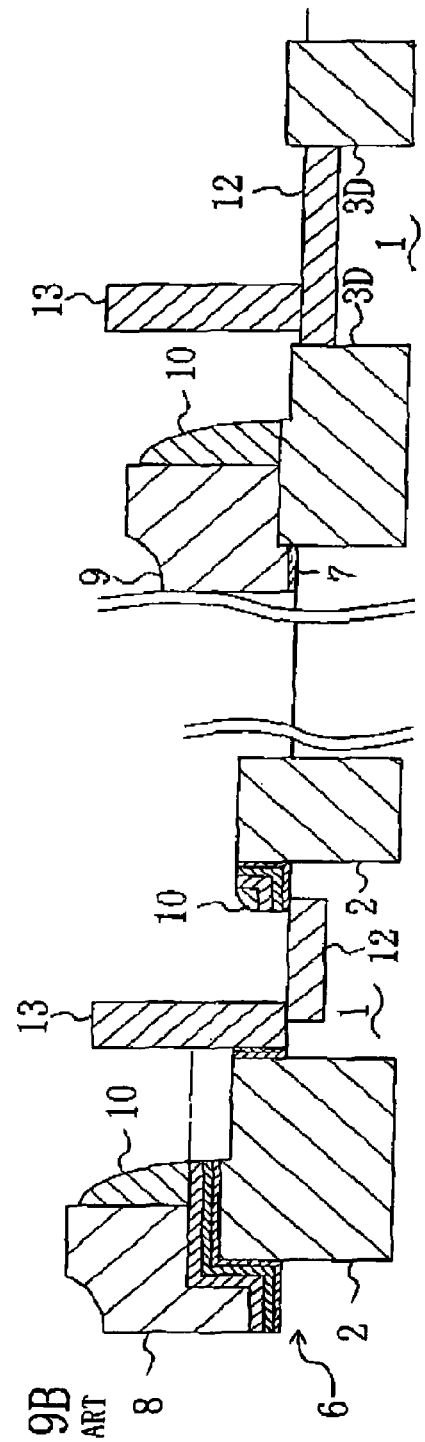

Furthermore, when as shown in FIG. 6B contacts 64 are formed on the silicide layers 62, the overlapping margins of the contacts 64 and the silicide layers 62 are not reduced unlike the known art shown in FIG. 9A but can be made large enough. The reason for this is that the step height between the first STI region 52 and the semiconductor substrate 51 is equal to or smaller than that between the second STI region 53 and the semiconductor substrate 51.

As described above, according to the first and second embodiments of the present invention, the step height between the first STI region 52 of the memory formation area 100 and the semiconductor substrate 51 is previously set equal to or smaller than that between the second STI region 53 of the CMOS formation area 200 and the semiconductor substrate 51. This can prevent the diffusion layer resistance from increasing due to reduction in the areas of the diffusion layers 12 that would conventionally arise from the sidewalls 10 formed on the sides of stepped portions of the first STI region 2 having a larger step height from the semiconductor substrate 1 than the step height between the second STI region 3D of the CMOS formation area 200 and the semiconductor substrate 1.

Furthermore, even when the diffusion layers 61 are silicided like the second embodiment, increase in thin-wire resistance and reduction in the overlapping margins of the contacts and the silicide layers 62 of the memory formation area 100 both due to reduction in the areas of the silicide layers 62 can be avoided.

The ONO film 56 that can store charges need not necessarily have a structure in which the silicon nitride layer 56b is interposed between the silicon oxide layers 56a and 56c. Therefore, for example, the lower silicon oxide layer 56a or the upper silicon oxide layer 56c need not necessarily be formed.

As described above, the semiconductor device according to the present invention and the method for fabricating the same can prevent, in the memory formation area, increase in the diffusion layer resistance or, when the diffusion layers are silicided, increase in the silicide thin-wire resistance and reduction in the overlapping margins of the contacts and the diffusion layers and is useful, in particular, as a semiconductor device comprising a memory section that includes an ONO film as a gate dielectric and a CMOS section and a method for fabricating the same.

What is claimed is:

1. A semiconductor device comprising:
   a memory section formed in a semiconductor region and including a first gate structure having a first gate electrode and a first gate dielectric that is formed directly on the semiconductor region and can store charges between the semiconductor region and the first gate electrode and a first isolation region; and
   a logic section formed in the semiconductor region and including a second gate structure having a second gate electrode and a second gate dielectric and a second isolation region,
   wherein, in the memory section, the first gate dielectric and the first gate electrode are formed to partly cover the first isolation region,
   in the logic section, the second gate electrode is formed to partly cover the second isolation region,
   the height of the top surface of a part of the first isolation region partly covered with the first gate dielectric and the first gate electrode from the top surface of the semiconductor region is equal to or smaller than the height of the top surface of a part of the second isolation region partly covered with the second gate electrode therefrom,
   a composition of the first gate dielectric is different from that of the second gate dielectric, and
   the first gate dielectric is a multilayer film of silicon nitride and silicon oxide.

2. The device of claim 1, wherein
   the first gate dielectric is an ONO film (a multilayer film obtained by successively stacking a silicon oxide film, a silicon nitride film and a silicon oxide film).

3. The device of claim 1, wherein
   the first and second isolation regions are trench isolation regions.

4. The device of claim 1, wherein
   the memory section has a diffusion layer formed in the upper part of the semiconductor region, and
   a metal silicide layer is formed on the diffusion layer.

* * * * *